US00RE35366E

United States Patent [19]

Hall

[11] E Patent Number: Re. 35,366

[45] Reissued Date of Patent: Oct. 29, 1996

[54] APPARATUS AND METHOD FOR OPTICAL SIGNAL SOURCE STABILIZATION

[75] Inventor: David B. Hall, La Crescenta, Calif.

[73] Assignee: Litton Systems, Inc., Woodland Hills, Calif.

[21] Appl. No.: 347,493

[22] Filed: Nov. 30, 1994

Related U.S. Patent Documents

Reissue of:

[64] Patent No.: 5,167,444
Issued: Dec. 1, 1992
Appl. No.: 565,641
Filed: Aug. 13, 1990

[51] Int. Cl.[6] ..... G02B 6/26

[52] U.S. Cl. ..... 385/15; 385/14; 385/24; 385/42; 356/346; 356/352; 372/32

[58] Field of Search ..... 356/346, 351, 356/352; 250/550; 372/29, 32; 385/15, 24, 27, 31, 39, 42, 51, 14

[56] References Cited

U.S. PATENT DOCUMENTS

| | | | |
|---|---|---|---|
| 4,084,907 | 4/1978 | Pinyard | 356/346 |
| 4,173,442 | 11/1979 | Snyder | 356/346 |
| 4,299,490 | 11/1981 | Cahill et al. | 356/350 |
| 4,305,046 | 12/1981 | Le Floch et al. | 331/94.5 |
| 4,386,822 | 6/1983 | Bergh | 385/15 X |
| 4,410,275 | 10/1983 | Shaw et al. | 385/42 X |
| 4,493,528 | 1/1985 | Shaw et al. | 356/350 |
| 4,529,262 | 7/1985 | Ashkin et al. | 385/15 X |
| 4,792,956 | 12/1988 | Kamin | 372/29 |
| 4,842,358 | 6/1989 | Hall | 385/15 X |
| 4,887,900 | 12/1989 | Hall | 356/350 |
| 4,890,922 | 1/1990 | Wilson | 356/350 |

OTHER PUBLICATIONS

Kaminow, "Balanced Optical Discriminator," Applied Optics, vol. 3, No. 4, Apr. 1964, pp. 507–510.

Kimura et al., "Temperature Compensation of Birefringent Optical Filters," Proceedings of the IEEE, Aug. 1971.

White, "Frequency Stabilization of Gas Lasers," IEEE Journal of Quantum Electronics, vol. QE–1, No. 8, Nov. 1965, pp. 349–357.

*Primary Examiner*—Brian Healy
*Attorney, Agent, or Firm*—Lynn & Lynn

[57] ABSTRACT

The frequency of an optical signal output from an optical source is controlled by adjusting the frequency of the optical signal output from the signal source to maintain a selected optical transmission through a Fabry-Perot cavity.

20 Claims, 4 Drawing Sheets

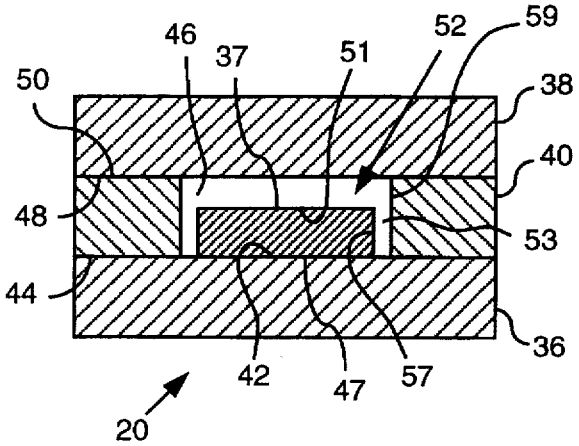
FIG. 2
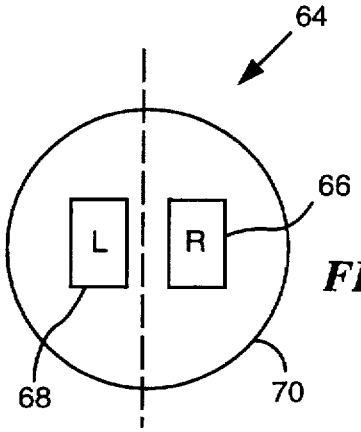
FIG. 4
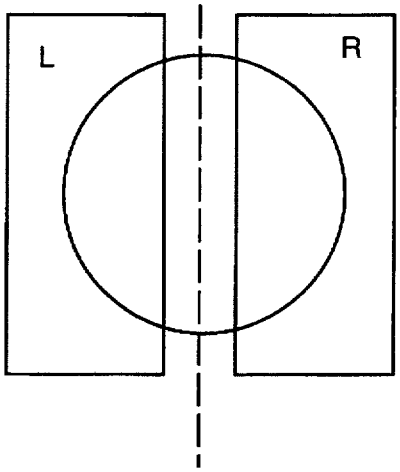
FIG. 5
FIG. 3
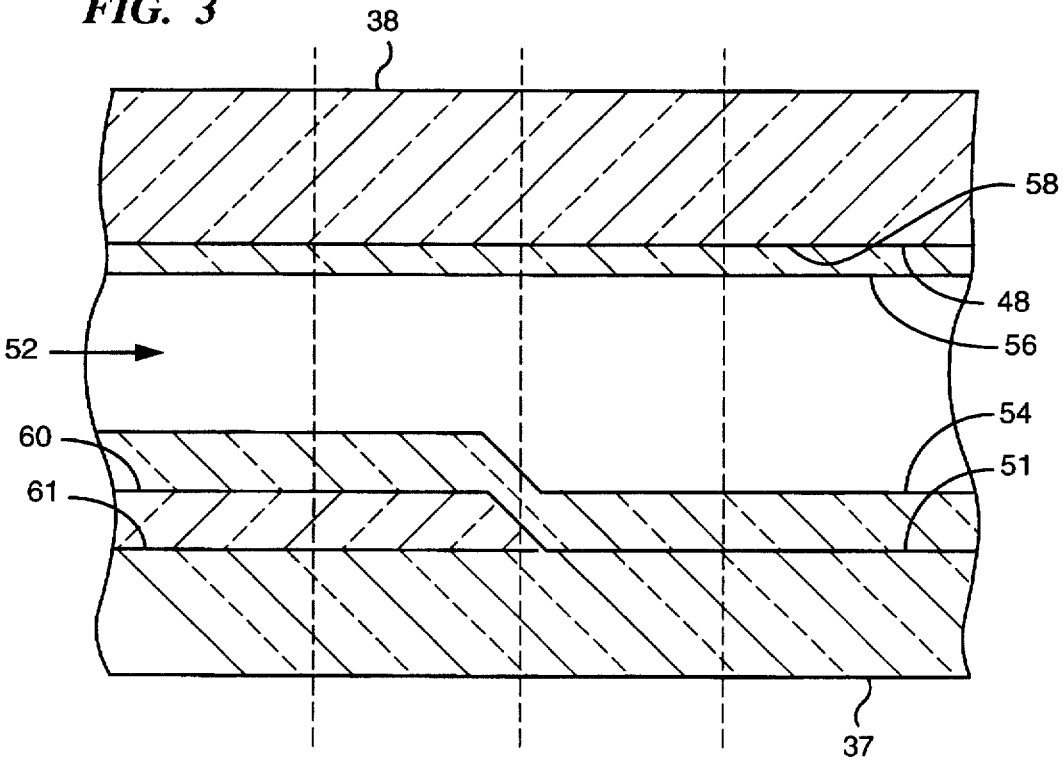

APPARATUS AND METHOD FOR OPTICAL SIGNAL SOURCE STABILIZATION

Matter enclosed in heavy brackets [ ] appears in the original patent but forms no part of this reissue specification; matter printed in italics indicates the additions made by reissue.

BACKGROUND OF THE INVENTION

This invention relates generally to apparatus and methods for controlling the frequency of light output from an optical signal source. This invention is particularly related to apparatus and methods for controlling the frequency of optical signals output from coherent light sources used in fiber optic rotation sensors.

Stability in the frequencies input to optical fibers is a practical necessity in the development and implementation of sensing systems using optical fibers. Optical sensing systems may use semiconductor diode lasers or superluminescent diodes as light sources. A high-precision fiber optic rotation sensor requires a stable light source because the scale factor of the sensor depends upon the source wavelength. For example, a navigation grade rotation sensor requires wavelength stability of about one part in $10^6$. A wideband source such as a superluminescent diode (SLD) or a narrower source such as a single or multimode laser diode needs frequency stabilization in order to be suitable as an optical source for a Sagnac ring fiber optic rotation sensor.

The SLD provides a spectral line width sufficient to overcome unwanted phase errors due to coherent backscatter and the Kerr effect. The fractional line width should be between 10 and 1000 parts per million (ppm). The frequency stability of the centroid of the source spectral distribution should be several ppm to meet scale factor stability and linearity requirements. Therefore, source width should be minimized within the constraints of coherent backscatter and Kerr effect errors to enhance scale factor linearity. The fractional line width should approach the lower portion of the 10 to 1000 ppm range to minimize unwanted errors in scale factor due to changes in the source spectral distribution over time.

The wavelength of the light emitted from a laser diode varies as a function of the operating temperature and the injection current applied. Effective use of a superluminescent diode as a light source in an optical rotation sensor requires an output of known wavelength. In fiber optic rotation sensing applications, the frequency stability should be about $\Delta f/_f=10^6$, and the light source should be held at a constant temperature.

U.S. Pat. No. 4,842,358 which issued to the present inventor and which is assigned to Litton Systems, Inc., the assignee of the present invention, discloses optical signal source stabilization using an interferometer to form to optical beams. The disclosure of U.S. Pat. No. 4,842,358 is hereby incorporated by reference into the present disclosure. U.S. Pat. No. 4,842,358 discloses a pair of birefringent crystals placed in the optical path of a light beam output from an optical signal source. The crystals have polarization dependent refractive indices and produce a first beam having an intensity $I_0(1+\cos\phi)$ and a second beam having an intensity $I_0(1-\cos\phi)$. At the desired source frequency the two intensities are equal. The difference of the two intensities is used to form an error signal that is used to servo the source drive current to produce a signal having a frequency that minimizes the error signal. Instead of using two crystals to form an interferometer, a fiber optic Mach-Zehnder interferometer may be used to form the two beams that are processed to form the error signal.

SUMMARY OF THE INVENTION

The present invention provides an apparatus and a method for overcoming the difficulties in stabilizing the frequency of optical signals output from light sources such as those used in optical rotation sensors.

A device according to the present invention for controlling the frequency of an optical signal output from an optical signal source comprises an interferometer that preferably includes a first plate formed to comprise a transparent material, The incident light is substantially normally incident on a first surface of the first plate. The device includes a second plate formed to comprise a transparent material. The first and second plates have facing surfaces that are generally parallel and optically flat. The device includes a third plate of a selected thickness mounted to the second plate between the first and second plates. The first and second plates are separated by a distance that is greater than the thickness of the third plate by a predetermined amount to define a Fabry-Perot cavity between the first and third plates. The invention further includes means for adjusting the frequency of the optical signal output from the signal source to maintain a selected optical transmission through the Fabry-Perot cavity.

The device for controlling the frequency of an optical signal output from an optical signal source may further comprise a first layer of $TiO_2$ formed on the surface of the first plate that faces the Fabry-Perot cavity. The first layer of $TiO_2$ covers an area of the first plate such that all of the light transmitted through the first plate propagates through the first $TiO_2$ layer. A layer of $SiO_2$ is formed on a first portion of the third plate that faces the Fabry-Perot cavity such that a first portion of the light that propagates across the Fabry-Perot cavity passes through the $SiO_2$ layer into the third plate. A second portion of the light that propagates across the Fabry-Perot cavity passes into the third plate without passing through the $SiO_2$ layer. A second layer of $TiO_2$ is formed on the $SiO_2$ layer and on the second portion of the third plate such that in propagating from the first plate into the third plate, the first portion of the light propagates through two $TiO_2$ layers and one $SiO_2$ and the second portion propagates through two $TiO_2$ layers.

The $SiO_2$ layer preferably has a thickness of $\lambda/4$ where $\lambda$ is the wavelength of the optical signal output by the optical signal source and wherein the thickness of the $TiO_2$ layer is $\lambda/(4n)$ where n is an integer greater than one.

The interferometer preferably further comprises a layer of $SiO_2$ formed on a first portion of the first plate that faces the Fabry-Perot cavity such that a first portion of the light that propagates across the Fabry-Perot cavity passes through the first $SiO_2$ layer and a second portion of the light propagates across the Fabry-Perot cavity without passing through the $SiO_2$ layer, and a first layer of $TiO_2$ formed on the surface of the third plate that faces the Fabry-Perot cavity, the first layer of $TiO_2$ covering an area of the third plate such that all of the light transmitted through the third plate propagates through the first $TiO_2$ layer. The interferometer also preferably includes a second layer of $TiO_2$ formed on the $SiO_2$ layer and on the second portion of the first plate such that in propagating from the first plate into the third plate, the first portion of the light propagates through two $TiO_2$ layers and one $SiO_2$ and the second portion propagates through two $TiO_2$ layers.

The Fabry-Perot cavity may be evacuated, or it may be filled with a gas such as helium, air or nitrogen.

BRIEF DESCRIPTION OF THE DRAWINGS

FIG. 2 is a cross-sectional view of the interferometer according of FIG. 1;

FIG. 3 is a cross-sectional view of a second interferometer according to the present invention that may be used in the source stabilization system of FIG. 1;

FIG. 4 schematically illustrates detection of a beam transmitted through the interferometer of FIG. 2 to a detector where the beam is larger than the detector;

FIG. 5 schematically illustrates detection of a beam transmitted through the interferometer of FIG. 2 to a detector where the beam is smaller than the detector;

DESCRIPTION OF THE PREFERRED EMBODIMENT

Figure 1:
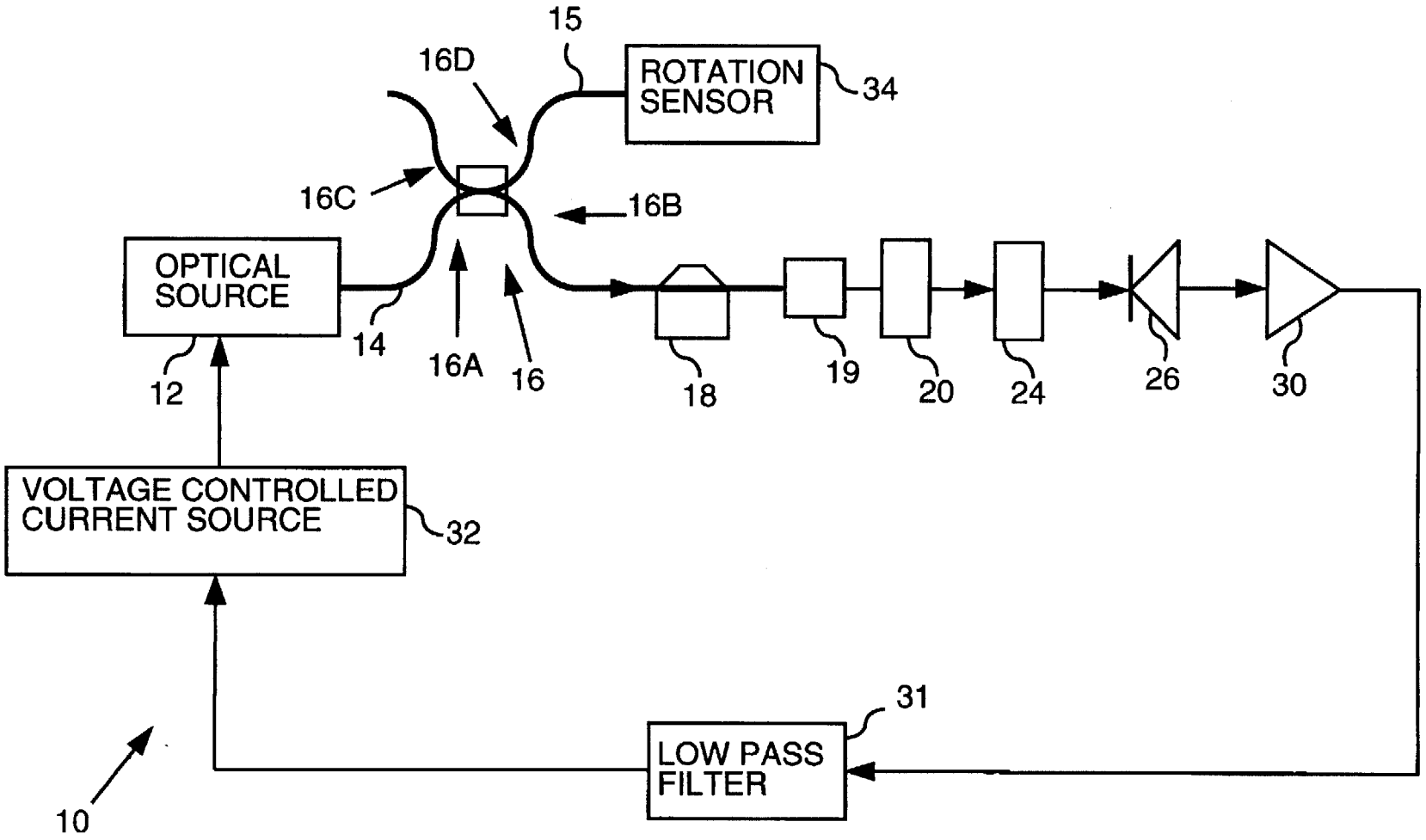
FIG. 1 is a schematic diagram of an optical source stabilization system according to the invention that may be used in a fiber optic rotation sensor.

FIG. 1 illustrates an optical source stabilization system 10 for controlling the wavelength of an optical signal output from an optical signal source 12, which may be a superluminescent diode (SLD). The optical source stabilization system 10 may include an optical fiber 14, an interferometer 20, a photodetector 26, a differential amplifier 30, a low pass filter 31, and a voltage controlled current source 32. The optical source stabilization system 10 may include means, such as a lens system 19, for directing light from the optical fiber 14 to the interferometer 20.

The optical source stabilization system 10 may also include a first polarizer 18 and a second polarizer 24 for polarizing light input to and output from the interferometer 24. The polarizers 18 and 24 are [optical] *optional* and are not required for the optical source stabilization system 10. The polarizer 18 may be a fiber optic polarizer that light before it exits the optical fiber 14. A suitable fiber optic polarizer structure for use in the present invention is disclosed in U.S. Pat. No. 4,386,822 to Bergh, the disclosure of which is hereby incorporated by reference into the present disclosure. However, other types of fiber optic polarizers known in the art may be satisfactorily used in the present invention.

Still referring to FIG. 1, the optical source stabilization system 10 may be used to stabilize the optical wavelength that is input to a fiber optic rotation sensor 34. U.S. Pat. Nos. 4,410,275 to Shaw et al and 4,842,358 to Hall disclose fiber optic rotation sensors with which the present invention may be used to provide source stabilization. The disclosures of U.S. Pat. Nos. 4,410,275 and 4,842,358 are hereby incorporated by reference into the present disclosure.

In such applications, a fiber optic coupler 16 may be used to couple a portion of the light from the optical fiber 14 into an optical fiber 15, which provides source light to the fiber optic rotation sensor 34. A suitable structure for the optical coupler is disclosed in U.S. Pat. No. 4,493,528, the disclosure of which is hereby incorporated by reference into the present disclosure.

The polarizer 18 may also be a conventional bulk optics polarizer that polarizes the light after it is emitted from the optical fiber 14. The polarizer 24 preferably is a bulk optics device. The polarizers 18 and 24 are not necessary for the present invention to function properly. However, in some applications the polarizers may be useful optimizing the source stabilization. The polarization perpendicular to the semiconductor junction of an SLD and the polarization parallel to the junction have different temperature sensitivities. The polarizers select a desired polarization for stabilizing the source. In a fiber optic gyroscope the polarization selected for stabilization preferably would be the polarization that propagates in the sensing loop.

Light from the optical source 12 propagates in the fiber 14 to a port 16A of the coupler 16. A first portion of the incident light cross couples in the coupler 16 and is output at a port 16D into the fiber 15 to be input to other apparatus such as the fiber optic rotation sensor 34. The light output at port 16D may be input to any device for which the optical source 16 is suitable.

A second portion of the light input to the optical coupler 16 remains in the fiber 14 and is output at a port 16B. This light output at port 16B is the signal that is processed to stabilize the source 12 to provide an optical output signal comprising essentially fixed wavelengths.

The source light output from port 16B of the coupler 16 then propagates in the fiber 14 to the first polarizer 18. The polarizer 18 may be either a conventional bulk optics linear polarizer or a fiber optic linear polarizer described subsequently.

FIG. 2 illustrates the basic structure of the interferometer 20. The interferometer 20 includes three discs 36–38 and a ring 40 that are preferably formed of a material having a low coefficient of thermal expansion. In a presently preferred embodiment of the invention, the three discs 36–38 and the ring 40 are formed of a glass-ceramic composite material. Such composite materials are commonly used in applications where small coefficients of thermal expansion are essential. The glass ceramic material includes a first component having a positive coefficient of thermal expansion and a second component having a negative coefficient of thermal expansion. Therefore, the glass-ceramic composite material is dimensionally very stable when it is subjected to temperature changes. Such thermally stable materials are well-known in ring laser gyroscope technology. A suitable commercially available material is known as zerodur.

Referring to FIG. 2, the disc 36 has an optically flat surface 42 that is in juxtaposition with an optically flat surface 44 on the ring 40. The ring 40 has a central cavity 46 therein. The disc 37 is located inside the cavity 46 and has a fast optically flat surface 47 that is juxtaposed with the optically flat surface 42 of the disc 36. The disc 37 has a second optically flat surface 51, and the ring 40 has a second optically flat surface The disc 38 has an optically flat surface 48 that is juxtaposed with the optically flat surface 50 of the ring 40. The discs 36 and 38 may have thicknesses of about 3 mm and radii of about 6 mm. The ring 40 may also have a thickness of 3 mm and a radius of 6 mm.

The disc 37 has a thickness that is less than the thickness of the ring 40 so that there is a gap 52 between the optically flat surface 51 of the disc 37 and the optically flat surface 48 of the disc 38. This gap 52 preferably has a thickness of about 10 μm or about 12λ, where λ is the wavelength of the source light. The gap spacing changes by only about 50 parts per billion per °C. shift in temperature. The radius of the disc may be about 2.8 mm which gives a 0.2 mm gap 53 between the side 57 of the disc 37 and the wall 59 of the cavity 46 in the ring 40.

FIG. 3 is a magnified view of the gap 52 between the upper surface 51 of the disc 37 and the bottom surface 48 of the disc 38. A first layer 54 of titanium dioxide ($TiO_2$) having a thickness of about a quarter wavelength of the source light is placed on the optically flat surface 51. A second layer 56 of $TiO_2$ is placed on the portion of the optically flat surface 48 that faces the optically flat surface 51. The thickness of the gap 52 is therefore about 10±1 μm. The disc 37 is formed of material having a refractive index $n_1$=1.54, and the $TiO_2$ has a refractive index $n_2$=2.32. The $TiO_2$ layers enhance the reflectivity. When a beam of the source light impinges at normal incidence upon the disc 38, part of the beam reflects at the upper edge of the disc. Part of the source light is transmitted into the disc 38. The transmitted portion of the beam propagates to the interface 58 between the substrate and the $TiO_2$ where part of the beam reflects and part is transmitted into the gap 52. Given the refractive indices of the $TiO_2$ and the material that forms the discs 36 and 38, the reflectivity for normal incidence at the interface 56 is given by $$R = \left( \frac{n_2^2 - n_1}{n_2^2 + n_1} \right)^2 = 0.308. \tag{1}$$

Equation (1) also gives the reflectivity at the other interfaces such as the interface 58 where the incident source light impinges upon a $TiO_2$ layer before entering the substrate material.

A normally incident collimated beam from the source has a transmission $$T_{12} = \frac{T^2}{1 + R^2 - 2R\cos\frac{4\pi g}{\lambda}}, \tag{2}$$

where g is the gap spacing and λ is the wavelength.

Figure 6:
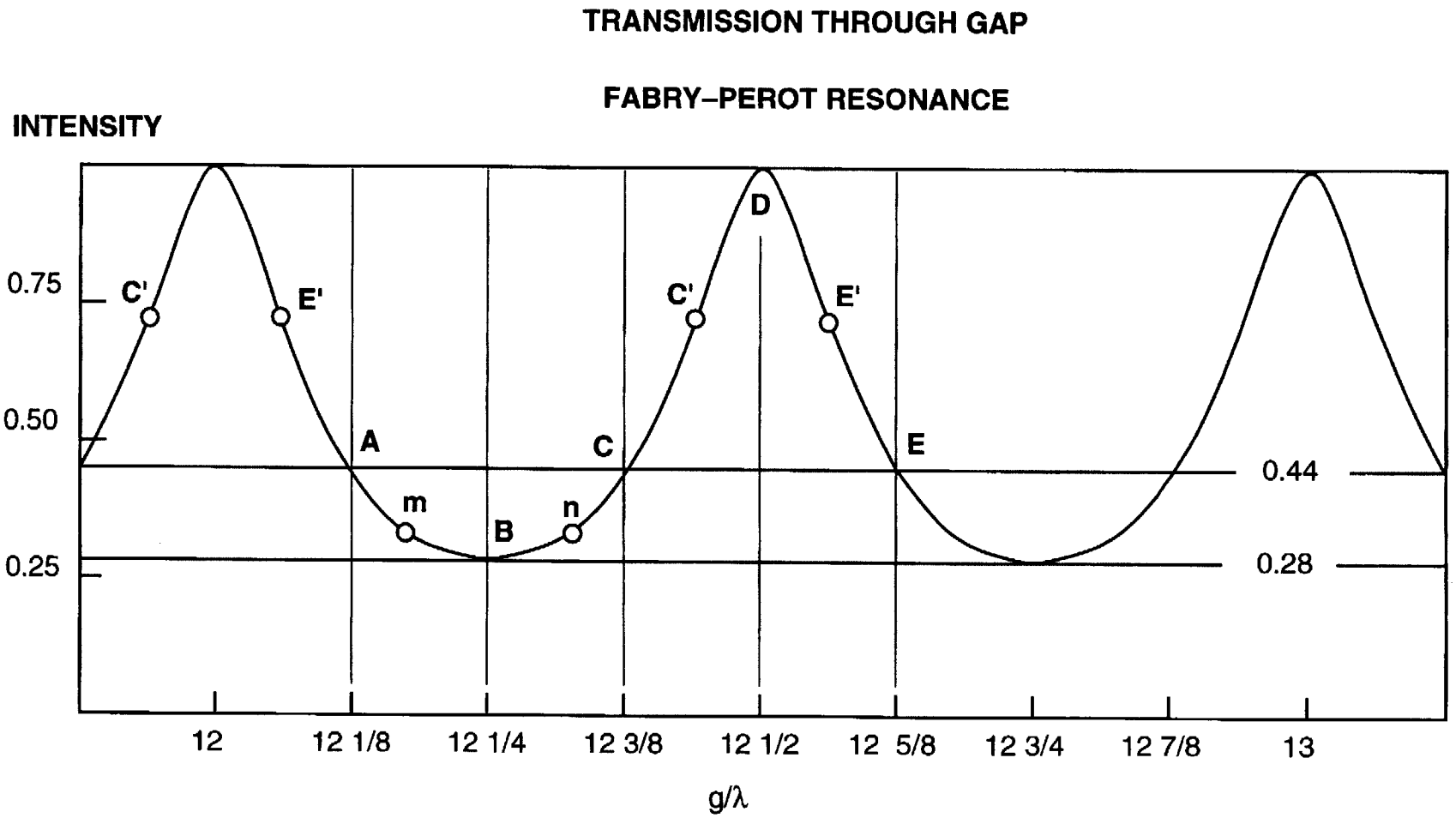
FIG. 6 graphically illustrates the intensity of light transmitted through the interferometer of FIG. 2.

Equation (2) gives the transmission of a Fabry-Perot cavity in which both mirrors have transmission T and reflection R. For the lossless case T+R=1.0. FIG. 6 graphically illustrates the transmission of the gap 52 as a function of g/λ based on Equations (1) and (2). The maxima occur at a gap spacing of an integral number of half wavelengths nλ/2 while the minima occur at a gap spacing of an integral number of wavelengths plus one quarter wavelength, (n+¼)λ. Maximum transmission is 100%, whereas minimum transmission is 28%.

Referring to FIG. 3, there may be an additional quarter wave layer 60 of silicon dioxide, $SiO_2$, deposited on a portion 61 of the surface 51 of the disc 37. The portion 61 of the surface 51 is about half of the area of the surface 51 that faces the disc 37. The refractive indices of the zerodur glass-ceramic composite material are sufficiently close that the $SiO_2$ spacer layer changes very slightly the reflectivity R of 0.308 given by Equation (1).

Instead of the $SiO_2$ layer, any single layer dielectric having a refractive index that is near that of the material used to form the discs 34–38 and the ring 40 will function satisfactorily. The gap may be formed by adding a material other than $TiO_2$ to the disc 37 or to the disc 38. For example, a thin film formed of either gold, a mixture of gold and chromium, or aluminum will function satisfactorily. A method such as ion beam etching may be used to form the gap.

Other high refractive index materials may be instead of the $TiO_2$ layer. For example zinc sulphide or tantalum dioxide may be used. The purpose of the high index material is to increase the intensity of the transmitted light. If sufficient light intensity is available, then the invention will function satisfactorily without the high index material. For example with no high index film, the 100% transmission level would drop to about 80%.

FIG. 6 graphically illustrates the transmission levels of the two beam halves. For example, if the portion of the gap without the spacer layer is 12.5 wavelengths thick, its transmission is given by point D as 100%. The transmission of the other portion of the gap is given by point B as 28%. An upward adjustment of the wavelength can move the two transmission levels from points D and B, respectively, to points C and A, both having equal transmissions of 44%. Similarly a decrease in the wavelength can move the transmission levels from points D and B to points E and C, respectively.

FIG. 4 illustrates a split level detector 64 that suitable for detecting the beam from the split level gap. The beam 70 falls on the split level detector 64, which has a right detector half 66 and a left detector half 68. FIG. 4 illustrates the case in which the diameter of the beam exceeds the size of the detector 64. FIG. 5 schematically illustrates detection of a beam transmitted through the interferometer of FIG. 2 where the beam is smaller than the detector.

The power incident on the right detector half 66 is given by $$R = \tfrac{1}{2}(I - \Delta I)T_{12} \tag{3}$$

where $T_{12}$ is given by Equation (2). The power incident on the left half of the split detector is given by $$L = \tfrac{1}{2}(I + \Delta I)T_{12} \tag{4}$$

where $$T_{12} = \frac{T^2}{1 + R^2 + 2R\cos\frac{4\pi g}{\lambda}}. \tag{5}$$

The difference between the signal levels given by Equations (3) and (4) is $$L - R = \tfrac{1}{2}I(T_{12} - T_{12}) + \tfrac{1}{2}\Delta I(T_{12} + T_{12}) \tag{6}$$

This analysis assumes that I and ΔI are non-zero only at one particular wavelength λ. A more complete analysis folds the source spectral distribution into Equation (6). However, the approximate treatment is sufficiently valid to obtain a reasonable estimate of servo performance.

Assume that the operating point for the interferometer above the right half is very near point E in FIG. 6, which means that $$\cos\frac{4\pi g}{\lambda} = \cos[50.5\pi + \delta] = -\delta. \tag{7}$$

A small adjustment in the wavelength produced by a servo that varies slightly the drive current of the optical source forces L–R to zero, which permits solution of Equation (6) for the ratio ΔI/I, which is $$\frac{\Delta I}{I} = \frac{T_{12} - T_{12}}{T_{12} + T_{12}} = \frac{-2R\delta}{1 + R^2}. \tag{8}$$

Using the relationship $$\frac{\Delta\lambda}{\lambda} = \frac{\delta}{50.5\pi}, \tag{9}$$

the fractional change in wavelength is related to the ratio of power imbalance to the total power as follows:

$$\frac{\Delta\lambda}{\lambda} = \frac{1+R^2}{101\pi R} \quad \frac{\Delta I}{I} = 0.011\,\frac{\Delta I}{I}\,. \tag{10}$$

Holding $\Delta I/I$ stable to 100 part per million stabilizes $\Delta\lambda/\lambda$ to one part per million. Fractional changed in $\Delta I$ and I are orders of magnitude larger than fractional shifts in $\Delta I/I$.

Superluminescent diodes used in forming fiber optic rotation sensors have a very limited range in wavelength tuning. Therefore, it is quite likely that an interferometer built with a constant gap of about 10 μm will not function properly with a particular SLD because the wavelength is incompatible with the gap width. Putting a small wedge having an angle of about 20 arc-sec or 0.0001 radian in the gap perpendicular to the plane shown in FIG. 2 allows adjustment of the gap width so that some point within 1 millimeter of the center of the gap 52 will have the proper width for any selected SLD.

The previous explanation of the invention assumes that the system includes a DC servo for wavelength stabilization. With sample and hold circuitry included in the system, the servo could be an AC device. For example, during the first half of a clock cycle, the right half of the detector may be monitored; and during the second half of the cycle the left half of the detector output is monitored. A square wave error signal is detected synchronously at the clock frequently with an amplitude proportional to (L–R) as given by Equation (5). A servo on the SLD drive current forces the square wave signal to zero.

Referring to FIG. 3, the spacer $SiO_2$ layer is about one quarter wavelength thick. If the spacer is only about one-eighth of a wavelength thick, then the points C' and E' in FIG. 6 would be the operating points for the wavelength stabilization servo. The slope is about twice as steep and C' and E' as it is at C and E; therefore, referring to Equation (9), about twice as much variation in $\Delta I/I$ can be experienced to obtain the same shift as is obtained with a DC servo. On the other hand, if the SLD wavelength differs from the desired value at the gap, for a 20 arc-sec wedge, it might be necessary to travel up to 2 mm to find a suitable operating point for an arbitrary SLD. In addition, operating points of equal intensity in FIG. 6 such as M and N should be avoided.

The optical signal output from the polarizer 24 is input to the detector 26, which forms electrical signals $i_1$ and $i_2$, respectively, that are indicative of the intensities of the optical signals transmitted across the two portions of the gap. The currents $i_1$ and $i_2$ are then input to a differential amplifier 30. The amplified difference signal is then input to a low pass filter 31, which may comprise a series resistor (not shown) and a capacitor (not shown) connected between the resistor and ground. The output of the low pass filter 31 is designated as $V_{LP}$. The signal $V_{LP}$ is then input to the voltage controlled current source 32, which forms a current output $i_F=\alpha V_{LP}$. The current $i_F$ is the servo current that controls the injection current applied to the optical source 12.

Figure 7:
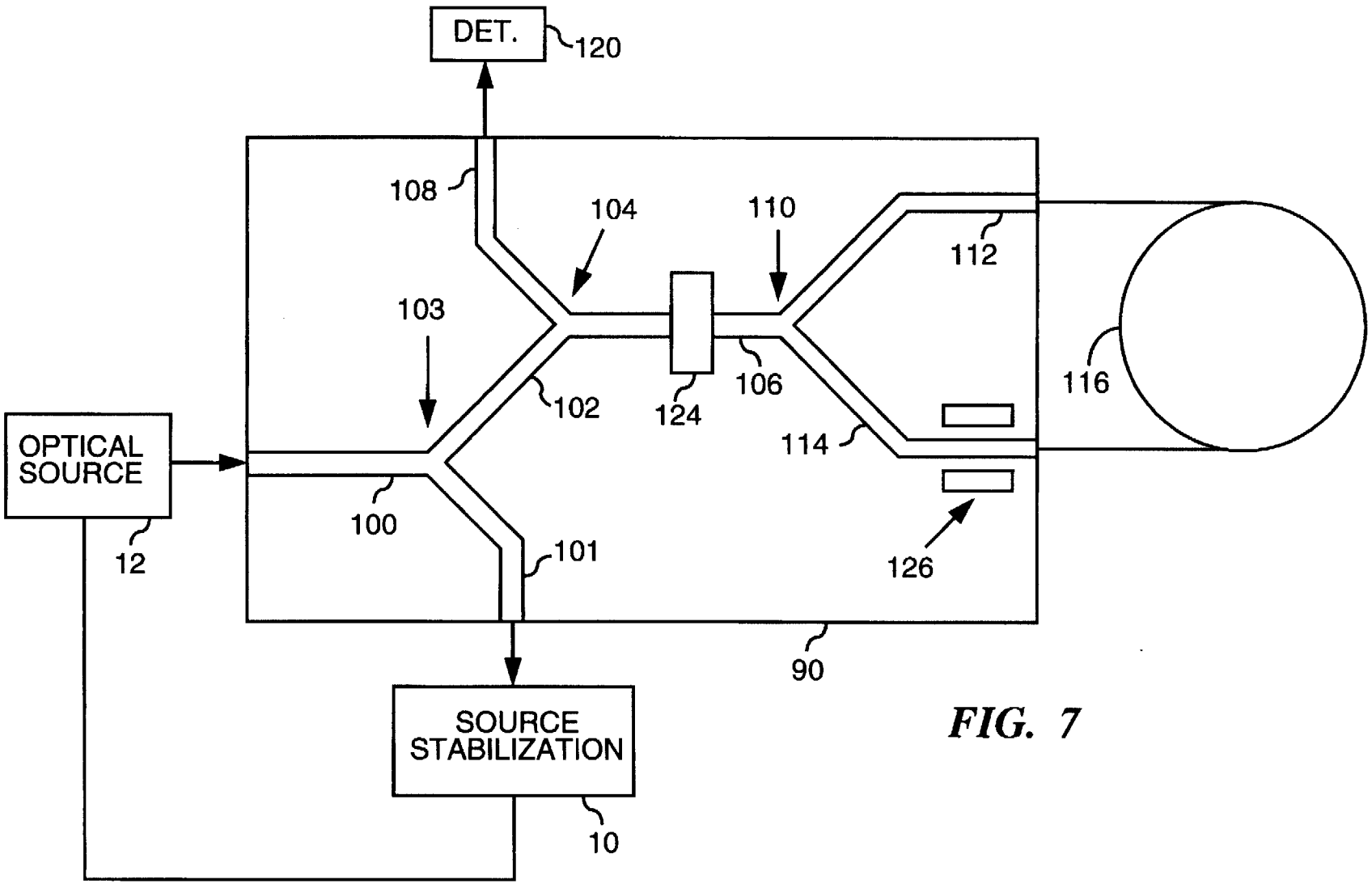
FIG. 7 schematically illustrates a fiber optic rotation sensor with which the source stabilization system of FIG. 1 may be used.

Referring to FIG. 7, some components of a rotation sensor 88 that may be used with the source stabilization system 10 according to the present invention may be formed on an integrated optics substrate 90. Optical waveguides may be formed on a layer of a material such as lithium niobate, for example, by doping portions of the lithium niobate with titanium ions. Three wavelengths 100–102 may be formed to meet at a junction 103 to form a Y-coupler. Light input from the light source 12 to the waveguide 100 divides at the junction 103 between the waveguides 101 and 102.

The waveguide 102 directs light to a second junction 104 where the waveguide 102 intersects a pair of waveguides 106 and 108. The waveguide 106 guides the input light to a junction 110 where the input light divides between a pair of waveguides 112 and 114. A fiber optic sensing coil 116 is optically coupled to the waveguides 112 and 114. The waveguides 112 and 114 introduce counterpropagating waves in the sensing coil 116.

After traversing the sensing coil 116, the counterpropagating waves combine at the junction and form an interference pattern that is the optical output of the sensing coil 116. The optical output of the sensing coil 116 divides at the junction 104 between the waveguides 102 and 108. A detector 120 receives the light guided by the waveguide 108 and produces electrical signals that may be processed to determine the rotation rate.

Other components, such as a polarizer 122 and a phase modulator 124 necessary for rotation sensing may be formed on the substrate 90 by placing electrodes on the substrate and applying suitable electrical signals to the electrodes by techniques well-known in the art.

Light guided by the waveguide 101 away from the junction 103 is directed to the source stabilization system, which is described previously with reference to FIG. 1.

The structures and methods disclosed herein illustrate the principles of the present invention. The invention may be embodied in other specific forms without departing from its spirit or essential characteristics. Therefore, the described embodiments are in all respects exemplary and illustrative rather than restrictive. Therefore, the appended claims, rather than the foregoing description, define the scope of the invention. All modifications to the embodiments described herein that come within the meaning and range of equivalence of the claims are within the scope of the invention.

What is claimed is:

1. A device for controlling the frequency of an optical signal output from an optical signal source, comprising: [means for polarizing the signal output from the optical signal source to provide a polarized signal;]

an interferometer arranged to receive the [polarized] *optical* signal, the interferometer including:

a first plate formed to comprise a transparent material, the first plate being arranged such that the [polarized] *optical* signal is substantially normally incident on a first surface of the first plate;

a second plate formed to comprise a transparent material, the first and second plates having facing surfaces that are generally parallel and optically flat;

a third plate having a selected thickness mounted to the second plate between the first and second plates; and means for separating the first and second plates by a distance that is greater than the thickness of the third plate by a predetermined amount to define a Fabry-Perot cavity between the first and third plates; and means for adjusting the frequency of the optical signal output from the signal source to maintain a selected optical transmission through the Fabry-Perot cavity.

2. The device of claim 1, further comprising:

a first layer of $TiO_2$ formed on the surface of the first plate that faces the Fabry-Perot cavity, the first layer of $TiO_2$ covering an area of the fast plate such that all of the light transmitted through the first plate propagates through the first $TiO_2$ layer;

a layer of $SiO_2$ formed on a fast portion of the third plate that faces the Fabry-Perot cavity such that a first portion of the light that propagates across the Fabry-Perot cavity passes through the $SiO_2$ layer into the third plate and a second portion of the light that propagates across the Fabry-Perot cavity passes into the third plate without passing through the $SiO_2$ layer; and a second layer of $TiO_2$ formed on the $SiO_2$ layer and on the second portion of the third plate such that in propagating from the first plate into the third plate, the first portion of the light propagates through two $TiO_2$ layers and one $SiO_2$ and the second portion propagates through two $TiO_2$ layers.

3. The device of claim 2 wherein the $SiO_2$ layer has a thickness of $\lambda/4$ where $\lambda$ is the wavelength of the optical signal output by the optical signal source and wherein the thickness of the $TiO_2$ layer is $\lambda/(4n)$ where n is an integer greater than one.

4. The device of claim 1 wherein the interferometer comprises:

a layer of $SiO_2$ formed on a first portion of the first plate that faces the Fabry-Perot cavity such that a first portion of the light that propagates across the Fabry-Perot cavity passes through the first $SiO_2$ layer and a second portion of the light propagates across the Fabry-Perot cavity without passing through the $SiO_2$ layer; and a first layer of $TiO_2$ formed on the surface of the third plate that faces the Fabry-Perot cavity, the first layer of $TiO_2$ covering an area of the third plate such that all of the light transmitted through the third plate propagates through the fast $TiO_2$ layer; and a second layer of $TiO_2$ formed on the $SiO_2$ layer and on the second portion of the fast plate such that in propagating from the first plate into the third plate, the first portion of the light propagates through two $TiO_2$ layers and one $SiO_2$ and the second portion propagates through two $TiO_2$ layers.

5. The device or claim 4 wherein the $SiO_2$ layer has a thickness of $\lambda/4$ where $\lambda$ is the wavelength of the optical signal output by the optical signal source and wherein the thickness or the $TiO_2$ layer is $\lambda/(4n)$ where n is an integer greater than one.

6. The device of claim 1 wherein the Fabry-Perot cavity is filled with helium gas.

7. The device of claim 1 wherein the Fabry-Perot cavity is filled with nitrogen gas.

8. The device of claim 1 wherein the Fabry-Perot cavity is evacuated.

9. The device of claim 1 wherein the first, second and third plates are formed of a thermally stable glass/ceramic composite material.

10. A method for controlling the frequency of an optical signal output from an optical signal source, comprising the steps of: [polarizing the optical signal output from the optical signal source to provide a polarized signal;]

forming an interferometer to receive the [polarized] *optical* signal, including the steps of:

forming a first plate to comprise a transparent material, the first plate being arranged such that [polarized] *optical* signal is substantially normally incident on a first surface of the first plate;

forming a second plate to comprise a transparent material, the first and second plates having facing surfaces that are generally parallel and optically flat;

mounting a third plate having a selected thickness to the second plate between the first and second plates; and separating the first and second plates by a distance that is greater than the thickness of the third plate by a predetermined amount to define a Fabry-Perot cavity between the first and third plates; and adjusting the frequency of the optical signal output from the signal source to maintain a selected optical transmission through the Fabry-Perot cavity.

11. The method of claim 10, further comprising the steps of:

forming a first layer of $TiO_2$ on the surface of the first plate that faces the Fabry-Perot cavity, the first layer of $TiO_2$ covering an area of the first plate such that all of the light transmitted through the first plate propagates through the first $TiO_2$layer;

forming a layer of $SiO_2$ on a first portion of the third plate that faces the Fabry-Perot cavity such that a first portion of the light that propagates across the Fabry-Perot cavity passes through the $SiO_2$ layer into the third plate and a second portion of the light that propagates across the Fabry-Perot cavity passes into the third plate without passing through the $SiO_2$ layer; and forming a second layer of $TiO_2$ on the $SiO_2$ layer and on the second portion of the third plate such that in propagating from the first plate into the third plate, the first portion of the light propagates through two $TiO_2$ layers and one $SiO_2$ and the second portion propagates through two $TiO_2$ layers.

12. The method of claim 11 including the steps of:

forming the $SiO_2$ layer to have a thickness of $\lambda/4$ where $\lambda$ is the wavelength of the optical signal output by the optical signal source; and forming the $TiO_2$ layer to have a thickness of $\lambda/(4n)$ where n is an integer greater than one.

13. The method of claim 10 wherein the interferometer is formed by steps comprising:

forming a layer of $SiO_2$ a first portion of the first plate that faces the Fabry-Perot cavity such that a first portion of the light that propagates across the Fabry-Perot cavity passes through the first $SiO_2$ layer and a second portion of the light propagates across the Fabry-Perot cavity without passing through the $SiO_2$ layer;

forming a first layer of $TiO_2$ on the surface of the third plate that faces the Fabry-Perot cavity, the first layer of $TiO_2$ covering an area of the third plate such that all of the light transmitted through the third plate propagates through the first $TiO_2$ layer; and forming a second layer of $TiO_2$ on the $SiO_2$ layer and on the second portion of the first plate such that in propagating from the first plate into the third plate, the first portion of the light propagates through two $TiO_2$ layers and one $SiO_2$ and the second portion propagates through two $TiO_2$ layers.

14. The method of claim 13 including the steps of:

forming the $SiO_2$ layer to have a thickness of $\lambda/4$ where $\lambda$ is the wavelength of the optical signal output by the optical signal source; and forming the $TiO_2$ layer to have a thickness of $\lambda/(4n)$ where n is an integer greater than one.

15. The method of claim 10 including the step of filling the Fabry-Perot cavity with helium gas.

16. The method of claim 10 including the step of filling the Fabry-Perot cavity with nitrogen gas.

17. The method of claim 10 including the step of evacuating the Fabry-Perot cavity.

18. The method of claim 10 including the step of forming the first, second and third plates of a thermally stable glass/ceramic composite material.

*19. The device of claim 1, further comprising means for polarizing the signal output from the optical signal source to provide a polarized signal.*

*20. The method of claim 10, further comprising the step of polarizing the optical signal output from the optical signal source to provide a polarized signal.*

* * * * *